United States Patent
Duggan et al.

(10) Patent No.: US 10,762,253 B2
(45) Date of Patent: Sep. 1, 2020

(54) DATAMODEL TUNING FOR SCARCE RESOURCE EVALUATION

(71) Applicant: Accenture Global Solutions Limited, Dublin (IE)

(72) Inventors: Desmond R. Duggan, San Jose, CA (US); Stephen Zoegall, New York, NY (US); Scott C. Kelly, Seattle, WA (US); Jennifer Mohrig, Chicago, IL (US); Teresa Sheausan Tung, San Jose, CA (US); Anuraag Chintalapally, Boulder, CO (US); Jaeyoung Christopher Kang, Berkeley, CA (US)

(73) Assignee: Accenture Global Solutions Limited, Dublin (IE)

( * ) Notice: Subject to any disclaimer, the term of this patent is extended or adjusted under 35 U.S.C. 154(b) by 684 days.

(21) Appl. No.: 15/618,470

(22) Filed: Jun. 9, 2017

(65) Prior Publication Data
US 2017/0357740 A1 Dec. 14, 2017

Related U.S. Application Data

(60) Provisional application No. 62/349,972, filed on Jun. 14, 2016.

(51) Int. Cl.
*G06F 30/20* (2020.01)
*G06Q 10/04* (2012.01)

(52) U.S. Cl.
CPC .............. *G06F 30/20* (2020.01); *G06Q 10/04* (2013.01)

(58) Field of Classification Search
None
See application file for complete search history.

(56) References Cited

U.S. PATENT DOCUMENTS

| | | | |
|---|---|---|---|
| 2011/0099126 A1* | 4/2011 | Belani | G06Q 30/0284 705/418 |
| 2012/0245981 A1* | 9/2012 | Volz | G07B 15/02 705/13 |
| 2014/0058711 A1* | 2/2014 | Scofield | G06Q 10/04 703/6 |

(Continued)

OTHER PUBLICATIONS

Shcherbak et al. "Chapter 8 Parking Lot Simulation", 28th EMCI Modelling Week Final Report, Jul. 26, 2015, 21 pages. (Year: 2015).*

(Continued)

*Primary Examiner* — Suzanne Lo
(74) *Attorney, Agent, or Firm* — Brinks Gilson & Lione

(57) ABSTRACT

Increases in global population have led to unprecedented challenges in meeting every day needs. Vehicle parking is one such challenge given the limited parking spaces available at any destination, whether at work, at a shopping center, or any other location. A parking resource analysis system includes a stepwise simulator system and a role based access system. The stepwise simulator system tests, simulates, and tunes specific models for issuing parking control actions with respect to a specific lot. The role based access system may be physically located at the parking lot. The role based access system implements dynamic loading or dynamic access of role specific models for issuing parking control actions tailored to the role of the particular individual searching for a parking space.

20 Claims, 7 Drawing Sheets

(56) References Cited

U.S. PATENT DOCUMENTS

2016/0132944 A1* 5/2016 Potkonjak ........ G06Q 10/06375
705/7.31
2016/0247326 A1* 8/2016 de Souza .............. H04L 67/306

OTHER PUBLICATIONS

Office Action in Australia Application No. 2017283732, dated Aug. 7, 2019, 5 pages.
International Search Report and Written Opinion for corresponding International application No. PCT/IB2017/000819, dated Sep. 27, 2017.
Robert N. Charette, "Smart Parking Systems Make It Easier to Find a Parking Space," posted Oct. 1, 2007, IEEE Spectrum, printed on Oct. 27, 2017 from Internet address: https://spectrum.ieee.org/green-tech/advanced-cars/smart-parking-systems-make-it-easier-to-find-a-parking-space, 2 pgs.
Office Action in Europe Application No. 17754191.9, dated May 20, 2020, 8 pages.

* cited by examiner

DATAMODEL TUNING FOR SCARCE RESOURCE EVALUATION

PRIORITY CLAIM

This application claims priority to U.S. Provisional Application No. 62/349,972 filed 14 Jun. 2016 which is entirely incorporated by reference.

TECHNICAL FIELD

This application relates to tuning datamodels that evaluate scarce resources in complex topographies, e.g. thousands of parking spaces among multiple lots on a corporate campus.

BACKGROUND

Increases in population have led to unprecedented challenges in meeting every day needs. Vehicle parking is one such challenge given the limited parking spaces available at any destination, whether at work, at the airport, at a shopping center, or any other location. Improvements in modelling the use of such scarce resources will help meet the challenges that have arisen.

DETAILED DESCRIPTION

Figure 1:
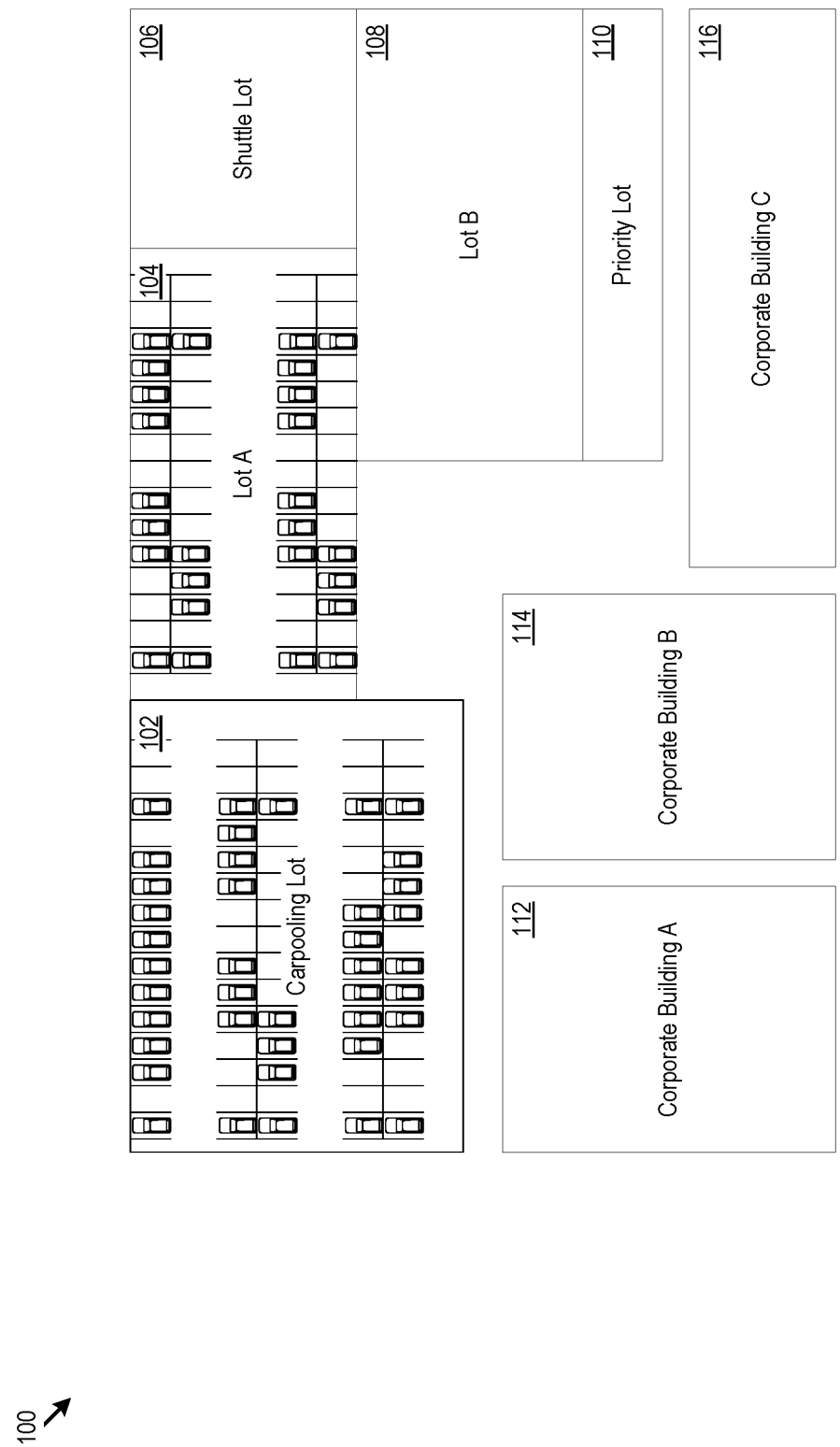
FIG. 1 shows an example campus topography including parking lots and corporate buildings.
Figure 2:
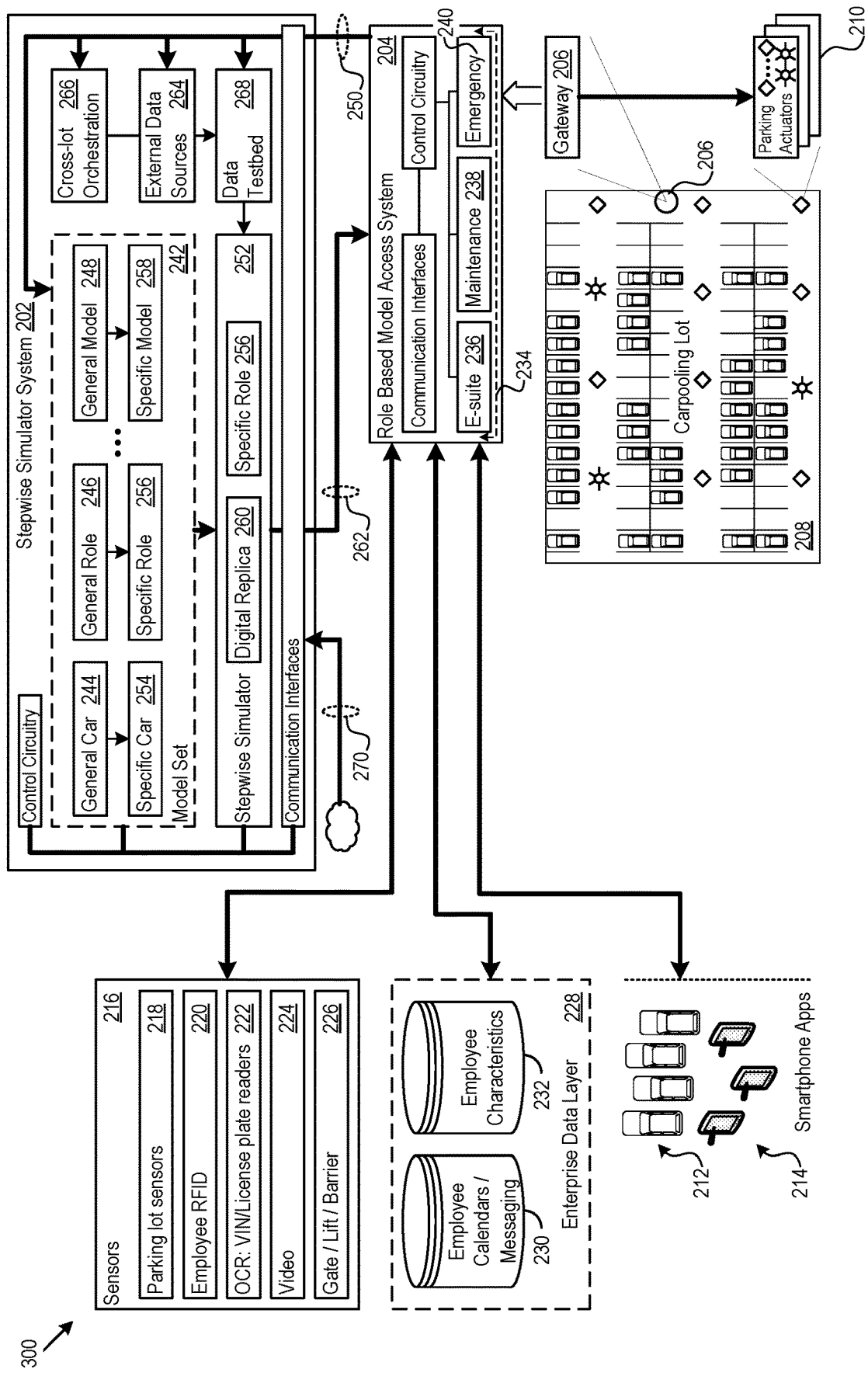
FIG. 2 shows an example implementation of a parking resource analysis system including a stepwise simulator system and role based model access systems, e.g., located on premise at specific parking lots.

FIGS. 1 and 2 provide an example context for the discussion below of the technical solutions surrounding stepwise simulation with specifically tuned models for evaluating scare resources, e.g., parking spaces, as well as role-based access to such models. The examples in FIGS. 1 and 2 show one of many possible different implementation contexts and campus topographies. In that respect, the technical solutions are not limited in their application to the architectures and topographies shown in any of the Figures, but are applicable to many other system implementations and topographies.

FIG. 1 shows an example campus topography 100 including separate parking lots 102, 104, 106, 108, 110, and corporate buildings 112, 114, 116. There may be hundreds or tens of thousands of individual parking spaces in the lots 102-110, and each may have different characteristics, such as distance from the buildings 112-116; permitted parkers or permitted vehicles, e.g., executive spaces, electric cars only, or spaces for the disabled; and whether shuttle service is available, e.g., from the shuttle lot 106 to the corporate buildings 112-116. Every day, employees expend significant resources in time, energy, money, and fuel to find a parking space. The stepwise simulator system ("simulator system") and role based model access system ("access system") described below improve the efficiency of finding parking spaces and thereby reduce resource expenditures, e.g., electric and fossil fuel energy expenditure on a wide scale to yield significant energy saving impact.

Figure 3:
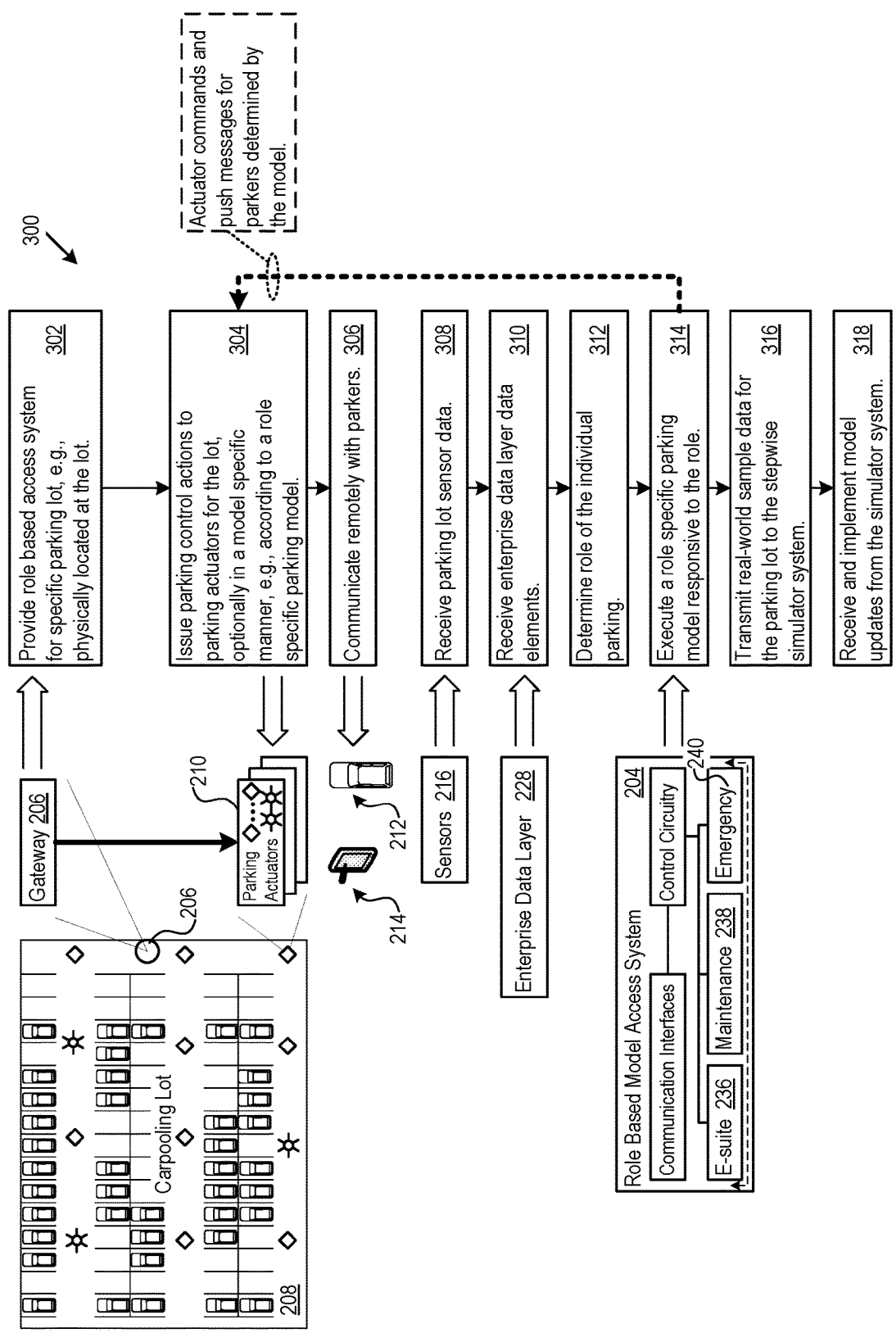
FIG. 3 shows an example of logic implemented in a role based model access system.

FIG. 2 shows an example architecture for a parking resource analysis system 200. The architecture includes the simulator system 202 and the access system 204. The discussion below of the access system 204 also makes reference to FIG. 3, which shows an example of role based model access logic 300 that the access system 204 may implement The access system 204 may be physically present, e.g. within or in the form of a parking gateway 206, at the particular parking lot 208 that the access system 204 models and for which it generates parking control actions (302). The parking control actions may include controlling parking actuators 210 within, adjacent to, or proximate the parking lot 208 (304) that actually direct traffic and specific parkers. These directions flow from regularly updated models that capture improvements in the understanding of how traffic moves through the actual parking lot as it operates, thereby yielding increasing parking efficiencies as the model evolves.

As one example, the parking actuators 210 may include above-ground or in-ground illuminated directional arrows providing guidance to an open, assigned, or recommended parking space. As another example, the parking actuators 210 may include bitmap or character displays that display parking directions, graphics, warning, recommendations, alerts, meeting reminders or other information of arbitrary complexity received from the access system 204 for any particular driver, including on a specific per-driver basis. As additional examples, the parking actuators 210 may include above-ground or in-ground parking lights and vector signs within the parking lot 208 to provide further guidance to an individual to a particular parking space. Further examples of parking actuators 210 include gates, barriers, and lifts remotely operated by control signals from the access system 204.

The communication interfaces in the access system 204 may also engage in remote communications between the access system 204 and drivers 212, e.g., via smartphone applications 214 executed on smartphone carried by the drivers 212 (306). The access system 204 may deliver a wide range of information to the smartphone applications. Examples include counters of free spaces, directions to open spaces, descriptions, maps, or directions of arbitrary complexity and tailored to any particular driver.

The communication interfaces in the access system 204 also communicate with sensors 216 (308). Accordingly, the access system 204 may receive parking lot specific input and regularly update its state model of the parking lot 208. Examples of the sensors 216 includes parking lot sensors 218, e.g., pressure sensors, WiFi sensors, and cameras to detect which spaces in any given lot are open or filled; RFID card or badge sensors 220, e.g., to detect and identify particular parkers entering or leaving the parking lot 208; optical character recognition (ORC) sensors (e.g., a digital camera) to read license plates or vehicle identification numbers (VINs); video sensors 224, e.g., to read license plates, capture facial images for facial recognition, and capture vehicle images to detect which type of vehicle is entering or leaving the parking lot 208; and gate/lift/barrier circuitry and sensors 226, e.g., to detect the open/close/up/down status of lifts, gates, and other barriers within the parking lot 208.

The communication interfaces in the access system 204 also communicate with an enterprise data layer 228 that stores data elements associated with a pre-determined enterprise (310). The enterprise data layer 228 may include volume storage devices that define and store database table structures. The access system 204 may access the data elements, e.g., through a database control system, as part of its analysis to determine parking control actions tuned to specific individuals. In the example shown in FIG. 2, the enterprise data layer 228 includes employee calendar data 230 that includes, e.g., meeting dates and times, and task execution requirements; and employee characteristics 232 (for instance, stored in a human resources database) that describe, e.g., employee role, level, or position; disabilities; birthdays; work hours; and other characteristics. These access system 204 may apply these particular data elements in its modeling to support individually specific parking analysis and parking control actions, e.g., responsive to the role of any given member of a pre-determined enterprise, such as the CEO. Any of the databases may be part of a single database structure, and, more generally, may be implemented as data stores logically or physically in many different ways. For instance, the employee characteristics 232 may be present in a human resources database, while the employee calendars may be present in an email server database.

In one implementation, the access system 204 implements role-specific modelling that guides a specific parker having a specific role to a parking spot chosen via the role-specific model. That is, the access system 204 determines a role for the individual who is parking (312) and implements role based access to any of a variety of parking models 234 available within the access system 204. The role based access may execute a role specific parking model (314) which may include, e.g., dynamically loading and executing a particular model or dynamically accessing, applying, or executing an already loaded model specifically adapted for the role.

The parking models 234 may vary widely. The three examples in FIG. 2 are the executive suite model 236, e.g., to provide priority routing to specific parking spaces to executive level parkers; the maintenance model 238, e.g., to provide special access parking instructions and parking spots for repair and maintenance vehicles (e.g., a natural gas, plumbing, road repair, elevator repair, window repair, or electrician vehicle); and the emergency model 240, e.g., to provide the highest level of parking response to try to minimize delay for an emergency vehicle (e.g., an ambulance, a fire truck, a police car, or a military vehicle) to reach emergency response parking spots. Another example of a role-specific model is an employee seniority model which is tuned to provide decreasing wait time and increasing parking proximity to company buildings based on how long an individual has been employed at the company.

Note that the access system 204 may determine the role responsive to data inputs from the sensors 218, queries to the enterprise data layer 228, and other data inputs. For instance, an OCR sensor 222 indicating an emergency vehicle license plate may cause the access system 204 to apply the emergency model 240. As another example, the video sensor 224 may capture the face of the driver, and the access system 204 may query the facial image against the enterprise data layer 228 to determine that the driver is an executive level individual. In response, the access system 204 dynamically loads the E-suite model 236 to generate parking control actions for the arriving individual. The access system 204 may dynamically load or access the particular models responsive to sensed parameters such as fixed or variable geolocation or RFID proximity. For instance, when an emergency vehicle is within 300 feet of the parking lot 208, the access system 204 may execute the emergency model 240 in anticipation of the arrival of the emergency vehicle.

With respect to parking control actions, the access system 204 guides the parking journey by delivering navigation instructions to a particular parking spot, e.g., through increasingly specific parking actuators 210. In that regard, the access system 204 may deliver, control, and coordinate informational signage; convey space availability; open/close/raise/lower gates and lifts; provide information about which parking lot sections have what percentage of spaces available; provide signage describing hot spots of availability or individual spaces available; or take other actions. When an individual enters the parking lot 208, the access system 204 applies a role-specific parking model to that individual. The access system 204, responsive to the role-specific model outputs, controls the parking actuators 210 to guide the parking journey.

Expressed another way, the access system 204 may deliver parking recommendations in the form of a sequence of directions or recommendations, coordinated across multiple notification mechanisms. The access system 204 may execute the sequence of directions by sending any type of notification messages, including push notifications to smartphone applications and by controlling one or more digital signs, illuminators, or other message indicators along any path followed by the parker. For instance, the access system 204 may deliver parking guidance messages to a sequence of digital signs that the parker will pass on their route to any particular lot or space within a lot. As a specific example, the access system 204 may provide a status message on a digital sign that indicates congestion in the main lot, and illuminate a directional arrow on a digital sign that directs the parker to a shuttle lot. The access system 204 may then illuminate a directional arrow on a digital sign that directs the parker to a row of parking spaces, then illuminate an indicator proximate to a specific parking space within that row and in which the parker should park.

As noted above, the access system 204 may deliver parking model results to the individual through a smartphone application. For instance, the access system 204 may push parking recommendations to the smartphone application. As one example, the smartphone application may display, e.g., based on time of departure, the availability of spaces by zone or lot. People may inform the smartphone application that they have left for work, and the access system 204 may send alerts to the application regarding space availability. Parkers may thereby receive alerts and notifications concerning the predicted parking situation at their destination based on any particular set of factors applied by the model in the access system 204, including the role of the individual. In this regard, the access system 204 may implement predictive analytics, e.g., based on how long it will take the employee to go to work, using data over any particular timeframe, e.g., the last two months. When the employee arrives, the access system 204 may deliver real-time alerts as to which spaces are free. In support of guiding the individual, the access system 204 may synchronize the alerts to parking actuators visible to the employee. The access system 204 may also deliver supporting data on directions, weather, upcoming meetings, daily tasks to complete, or other information by collaborating with direction applications, map applications, weather applications, news applications, the enterprise data layer 228, and the like. As described further below, the access system 204 may transmit real-world sample data for the parking lot to the simulator system 202 (316) and receive and implement model updates from the simulator system 202 (318).

The access system 204 extends to the analysis of the campus as a whole. For instance, the access system 204 may integrate parking analysis with employee wellness programs discovered in the enterprise data layer 228. One example is helping employees meet walking challenges to walk a certain distance, and responsively guiding the employee to a space that has the requisite distance to the corporate building in which they work. As another example, the access system 204 may, via human resources data in the enterprise data layer 228, reserve closer or priority spaces to a person on their birthday, or implement lottery-based parking in which a person may randomly win a priority spot on any given day.

Figure 4:
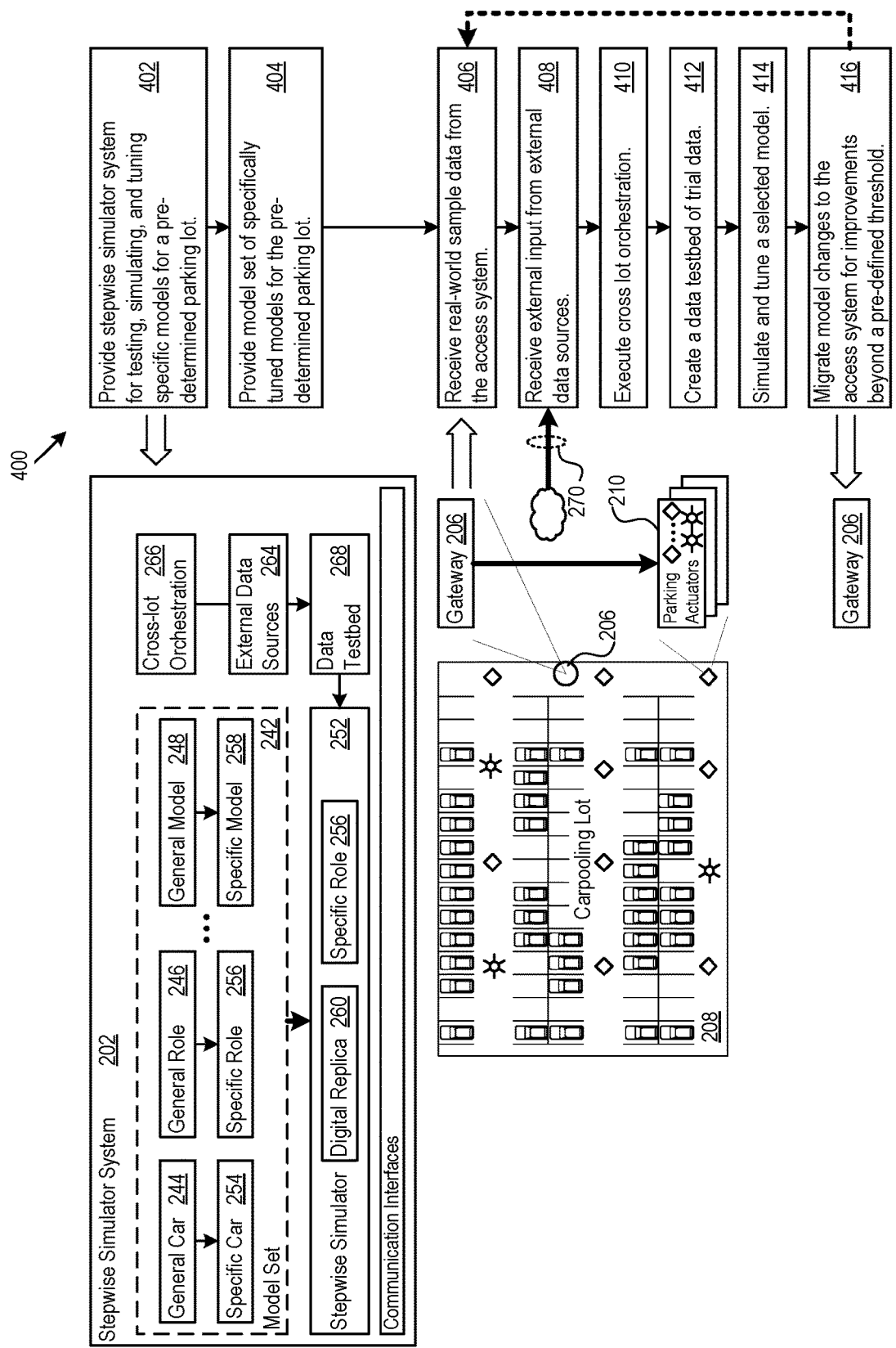
FIG. 4 shows an example of logic implemented in a stepwise simulator system.

FIG. 2 also illustrates the simulator system 202, and is described in connection with FIG. 4 which shows an example of stepwise simulator logic 400 that the simulator system 202 may implement. The simulator system 202 is provided in the parking resource analysis system 200 (402) and implements stepwise simulation of specifically tuned models for a specific lot, e.g., specific to the parking lot 208. The models are provided in the model set 242 (404). When first instantiated, the models may be untrained by real-world data, but generally representative of how to execute parking in the specific lot for a specific parking characteristic. For instance, there may be a general car model 244, a general role model 246 or other type of general characteristic model 248.

The simulator system 202 receives real-world sample data 250 from the access system 204 (406). The real-world sample data 250 represents, for instance, periodic reports from the access system 204 of the individuals, individual roles and other characteristics, vehicles, access model outputs (e.g., the parking actuator decisions), and other operational data occurring at the access system 204 with respect to the parking lot 208. In support of the simulation, testing, and tuning, the simulator system 202 receives data from external data sources 264 (408), executes cross-lot orchestration 266 (410), and creates a data testbed 268 of trial data (412) with which to test, simulate, tune, and train the models via the stepwise simulator 252 (414).

In some implementations, the stepwise simulator 252 in the simulator system 202 may be a multi-agent stepwise simulator. In those implementations, the stepwise simulator 252 processes the actors within the parking lot ecosystem as individual modeled components. The actors may be, e.g., the vehicles, gates, directional guidance boards, open spot lighting, cameras, or any other parking actuators 210 or sensors 216. A step in the stepwise simulator 252 may represent a pre-determined increment in time, e.g., 1 second. A one-second step means every step taken by the stepwise simulator 252 is 1 second forward in time. When the stepwise simulator 252 processes a step, the stepwise simulator 252 adjusts the actors in the model space, e.g., by updating position, orientation, speed, status, or other characteristic, and receives new input readings of some or all of the actors and the running models. The stepwise simulator 252 executes the stepwise simulation process repeatedly until it captures the aggregate behavior over time of the parking lot and the actors. The aggregate behavior can then be used to fine tune the models for better performance, e.g. to improve average traffic flow, and thereby create more specific models from general models.

The data testbed 268 may be formed and maintained in many different ways. For instance, the data testbed 268 may receive streamed time-series data from the actual physical lot being modeled, e.g., as the real-world sample data 250. The time-series data helps to capture the unique behaviors that occur in each parking lot. For example, vehicles in one lot often behave differently than vehicles in another lot. The streaming time-series data stores the vehicle behavior for replay through the stepwise simulator 252 to further tune the models for each particular parking lot.

The external data sources 264 acquire external input 270 on events beyond the sample data provided by the access system 204. Examples of external input 270 include high level events that reach beyond the parking lot 208, e.g., city-wide events like concerts, sporting events, and planned construction that may affect the number of cars, the people, and the traffic patterns, e.g., in the area of the parking lot 208. Other examples of external input 270 include weather forecasts that predict weather which will affect traffic patterns, and national calendar events such as Federal holidays or events relating to religion specific holidays. The cross-lot orchestration 266 analyzes opportunities to route parkers to different parking lots available at the specific enterprise location (e.g., the lot 102 vs. the lot 104), or across a wider area not necessarily owned or operated by the enterprise. As one particular example, the cross-lot orchestration 266 may execute a load balancing algorithm to attempt to achieve even distribution of parkers between multiple pre-determined parking lots. The data testbed 268 stores trial data to run through the stepwise simulator 252 to simulate, test, and tune the models. In that regard, the data testbed may include any of the sample data from the access system 204, the external data from the external data sources 264, cross-lot data inputs from the cross-lot orchestration 266, or other trial data received from another source (including a system operator).

The simulator system 202 receives the real-world sample data 250 and the external input 270. Given these data elements, the simulator system 202 executes the stepwise simulator 252 to evolve its general models 244-248 to specific models. FIG. 2 shows several examples of the transition to specific models, including the specific car model 254, the specific role model 256, and the specific characteristics model 258.

The simulator system 202 stores a digital replica 260 of the specific parking lot that is it modelling, e.g., the parking lot 208. The digital replica 260 may capture the physical parameters of the specific parking lot, including, e.g., the number and location of each spot; the size of each spot; the orientation of each spot; the type of spot, e.g., handicapped parking or emergency parking; hours of operation of individual spots, sections of the parking lot or of the parking lot as a whole; the road or lane access to each spot, including width or number of lanes, and length, position, and orientation of roads or lanes; and the type and location of parking actuators in the parking lot. Additional examples of physical parameters include lot and space entry points; exit points; office locations designations; personnel designations; permitted hours; security restrictions; specific space designations, e.g., visitor parking, executive parking, sales representative parking; the identifiers or communication addresses for sensors, signs, and other indicators associated with the parking structure or individual parking spaces; and other characteristics of the spaces.

The simulator system 202 tests changes to the evolving models before model updates 262 capturing those changes are migrated to the access system 204 to update the specific models executed in the access system 204 (416). As the simulator system 202 receives increasing amounts of sample data from the access system 204, the stepwise simulator 252 responsively tunes the models in the model set 242 into increasing more specific models. The tuning may be done to optimize on any pre-selected simulation metrics, e.g., lowest time to reach a parking spot, lowest wait time for a parking spot, lowest total parking time across the entire day for all parkers, lowest total parking time for a time window (e.g., 7 am to 10 am) for all parkers, or on other simulation metrics. When a model improves beyond a pre-defined update threshold (e.g., total parking time reduced by at least 1 hour), then the updated model (or its updated parameters) may be pushed to the access system 204 for use on-site at the parking lot 208. That is, the simulator system 202 emulates and tunes the models before deploying changes to the access system 204.

Figure 5:
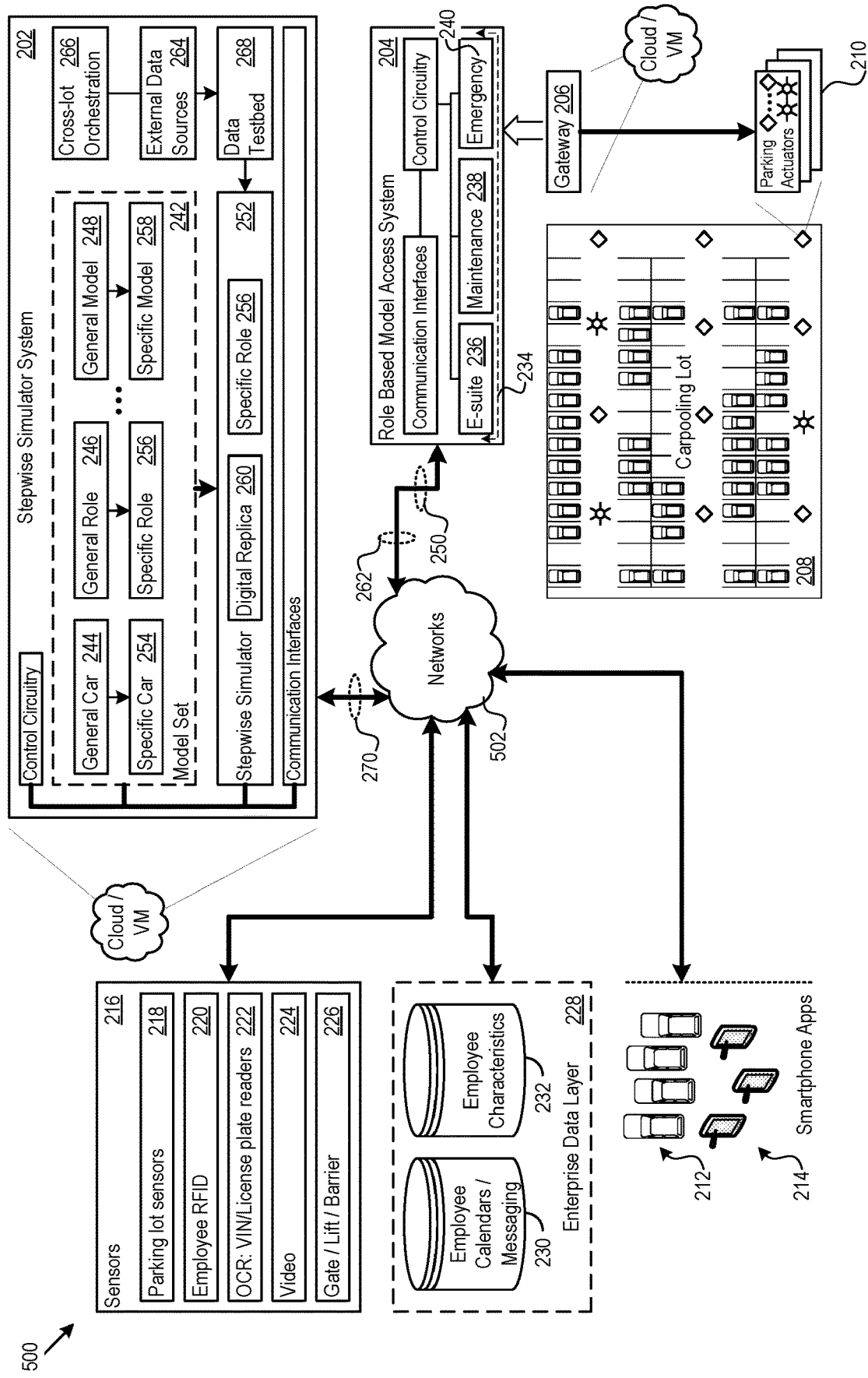
FIG. 5 shows another example of the parking resource analysis system.

FIG. 5 shows another example architecture for a parking resource analysis system 500. The architecture also includes the simulator system 202 and the access system 204, described above. FIG. 5 illustrates that the elements of the system 500 may be interconnected via any type or number of networks 502, and located in many different physical locations. For instance, although in some implementations the access system 204 is physically located at the parking lot 208, the access system 204 may be housed remotely in a corporate data center or in a cloud environment and communicate with the parking actuators 210 through the networks 502. Similarly, the simulator system 202 may be hosted in a virtual machine (VM) in any remote cloud provider, may be hosted in a VM within an on-premises enterprise data center, or may be a separate physical system located anywhere with network connectivity.

Figure 6:
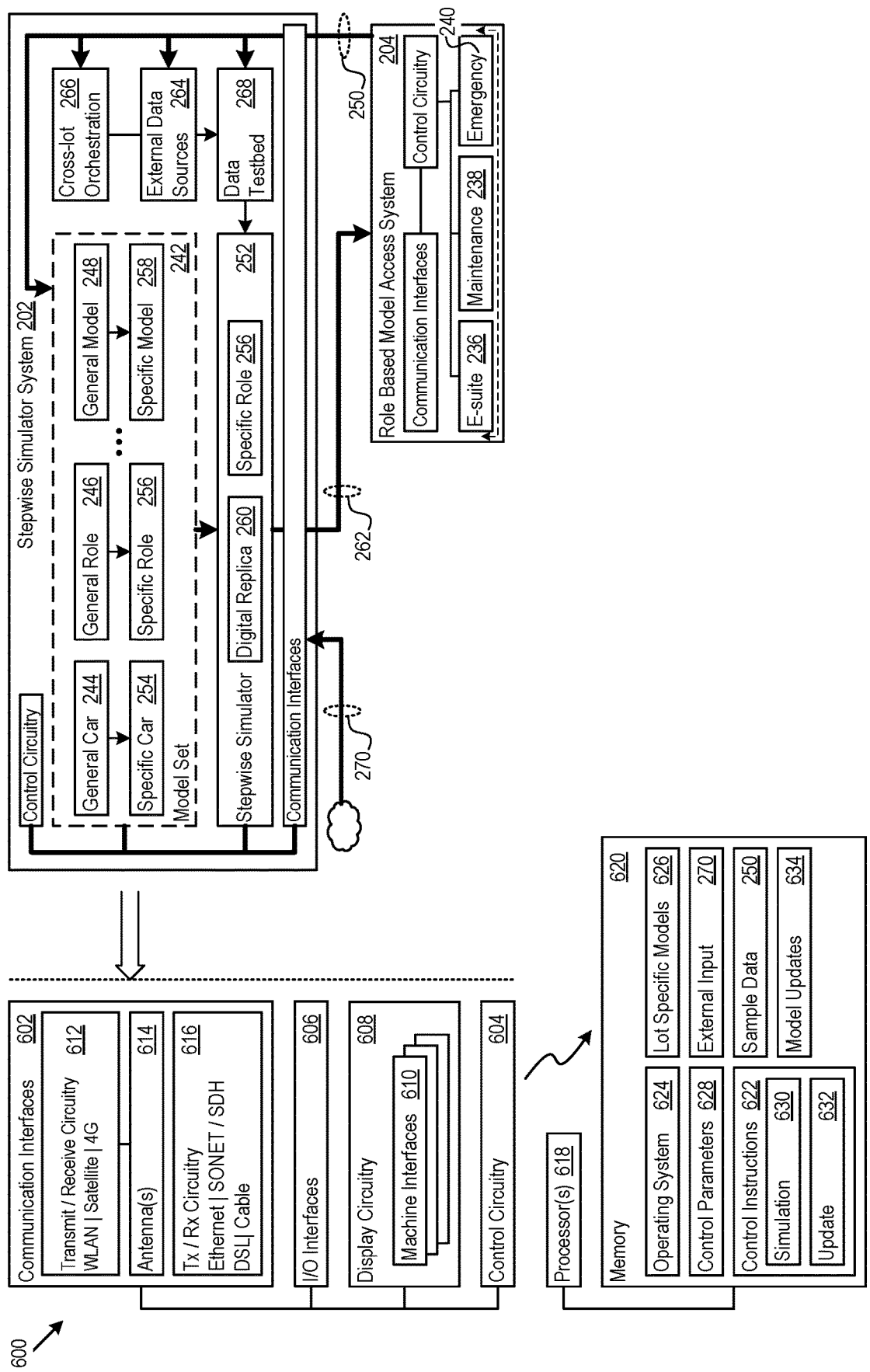
FIG. 6 shows an example implementation option for the simulator system.

FIG. 6 shows an example implementation option 600 for the simulator system 202 and an example implementation option 700 for the access system 204. The implementation options may define one or more physical or virtual machines, and may include communication interfaces 602, control circuitry 604, input/output (I/O) interfaces 606, and display circuitry 608. The display circuitry 608 generates operator interfaces 610 locally or for remote display, e.g., in a web browser running on a local or remote machine. The operator interfaces 610 and the I/O interfaces 606 may include GUIs, touch sensitive displays, voice or facial recognition inputs, buttons, switches, speakers and other user interface elements. Additional examples of the I/O interfaces 606 include microphones, video and still image cameras, headset and microphone input/outputs, Universal Serial Bus (USB) connectors, memory card slots, and other types of inputs. The I/O interfaces 606 may further include magnetic or optical media interfaces (e.g., a CDROM or DVD drive), serial and parallel bus interfaces, and keyboard and mouse interfaces.

The communication interfaces 602 may include wireless transmitters and receivers ("transceivers") 612 and any antennas 614 used by the transmit and receive circuitry of the transceivers 612. The transceivers 612 and antennas 614 may support WiFi network communications, for instance, under any version of IEEE 802.11, e.g., 802.11n or 802.11ac. The communication interfaces 602 may also include wireline transceivers 616. The wireline transceivers 616 may provide physical layer interfaces for any of a wide range of communication protocols, such as any type of Ethernet, data over cable service interface specification (DOCSIS), digital subscriber line (DSL), Synchronous Optical Network (SONET), or other protocol.

The control circuitry 604 may include hardware, software, firmware, or other circuitry in any combination. The control circuitry 604 may be implemented, for example, with one or more systems on a chip (SoC), application specific integrated circuits (ASIC), microprocessors, discrete analog and digital circuits, and other circuitry. The control circuitry 604 is part of the implementation of any desired functionality in the simulator system 202 and the access system 204.

As just one example, with regard to FIG. 6 and an implementation of the simulator system 202, the control circuitry 604 may include one or more instruction processors 618 and memories 620. The memory 620 stores, for example, control instructions 622, an operating system 624, and lot specific parking models 626. In one implementation, the processor 618 executes the control instructions 622 and the operating system 624 to carry out any functionality described above or below for the simulator system 202.

The control parameters 628 provide and specify configuration and operating options for the control instructions 622 and operating system 624. The control instructions 622 may include stepwise simulation instructions 630 and access system updating instructions 632. The stepwise simulation instructions 630 perform the model testing, simulation, and tuning to create specific models from generic models, while the access system updating instructions 632 communicate improved models or model parameters 634 to the access system 204.

Figure 7:
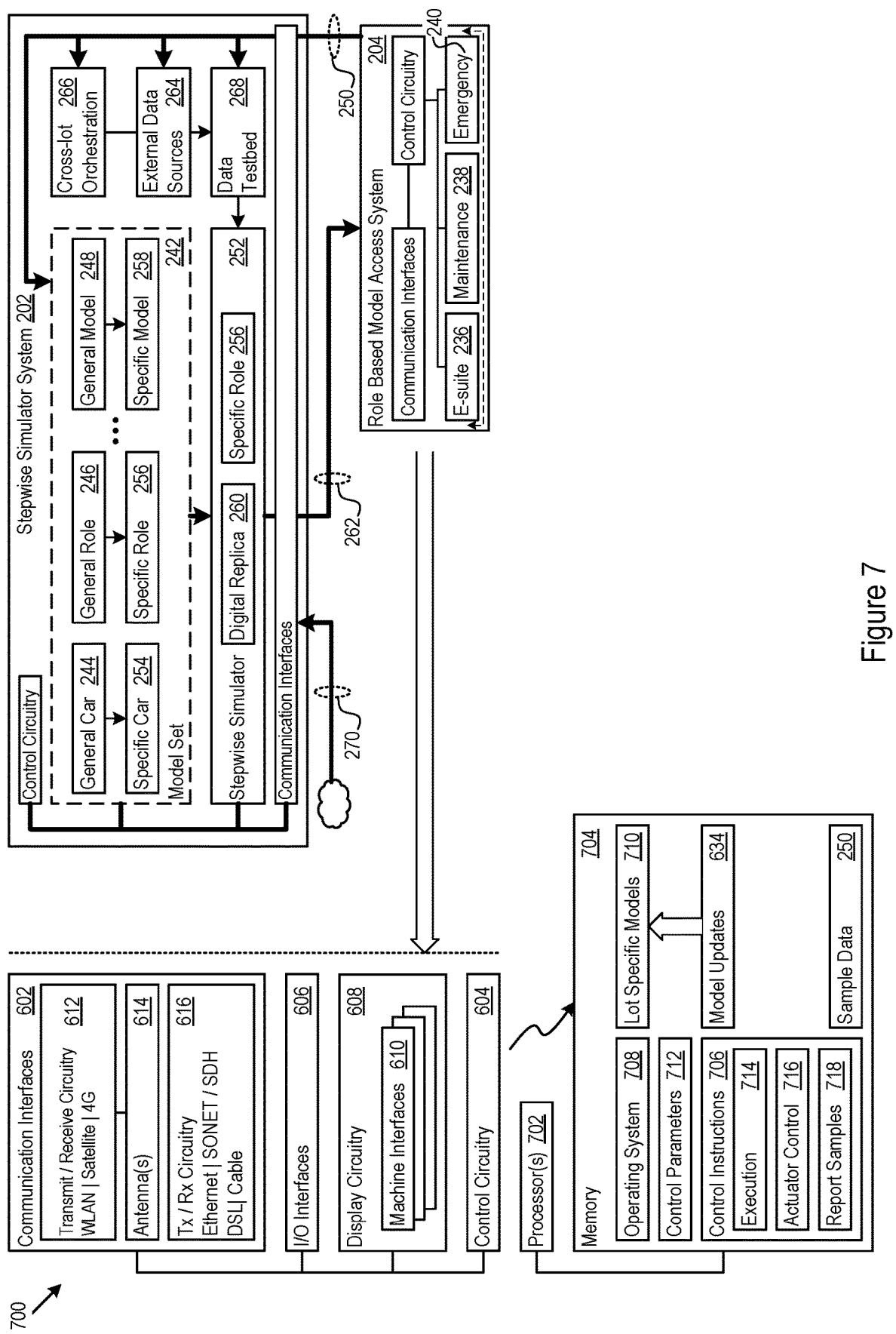
FIG. 7 shows an example implementation option for the access system.

With regard to FIG. 7 and an implementation of the simulator system 202, the control circuitry 604 may include one or more instruction processors 702 and memories 704. The memory 704 stores, for example, control instructions 706, an operating system 708, and lot specific parking models 710. As noted above, the access system 204 may dynamically load or access role specific and lot specific parking models responsive, e.g., to sensor data and enterprise data layer data. In one implementation, the processor 702 executes the control instructions 706 and the operating system 708 to carry out any functionality described above or below for the access system 204.

The control parameters 712 provide and specify configuration and operating options for the control instructions 706 and operating system 708. The control instructions 706 may include model execution instructions 714, actuator control instructions 716, and real-world data sample reporting instructions 718. The model execution instructions 714 apply the parking model matched to the individual who is parking, the actuator control instructions issue actuator signals to the parking actuators 210, and the real-world data sample reporting instructions 718 transmit the sample data 250 to the simulator system 202.

The role specific and parking lot specific modelling circuitry described above in the simulator system 202 and the access system 204 improve the functioning of the underlying computer hardware itself. These features (among others described above) are specific improvements in way that the underlying system operates to help the system more efficiently make decisions about scarce resources. Expressed another way, the improvements facilitate more efficient, accurate, and precise evaluation of scarce resources. The improvements help achieve important reductions in the expenditure of valuable, limited resources, including time, energy, money, and fuel to find a parking space.

The simulator system 202 and the access system 204 may be responsive to personalized preferences. That is, in any analysis it performs, the systems may take into consideration the preference settings established by any individual. As examples, the systems may consider individual preferences such as whether an individual prefers to have a walk (and how far) to their office, whether the individual needs to be closer to an office building due to an injury or other medical condition, whether the individual prefers to work from home rather than park at all, at which office locations they prefer to work and on what schedule, what type of vehicle they prefer to drive and need parking for, colleagues or friends that they prefer to park near, preferences for parking location based on the amount of daylight remaining at the end of the work day, and other preferences.

The methods, devices, processing, frameworks, circuitry, and logic described above may be implemented in many different ways and in many different combinations of hardware and software. For example, all or parts of the implementations of the simulator system 202 and the access system 204 may be circuitry that includes an instruction processor, such as a Central Processing Unit (CPU), microcontroller, or a microprocessor; or as an Application Specific Integrated Circuit (ASIC), Programmable Logic Device (PLD), or Field Programmable Gate Array (FPGA); or as circuitry that includes discrete logic or other circuit components, including analog circuit components, digital circuit components or both; or any combination thereof. The circuitry may include discrete interconnected hardware components or may be combined on a single integrated circuit die, distributed among multiple integrated circuit dies, or implemented in a Multiple Chip Module (MCM) of multiple integrated circuit dies in a common package, as examples.

Accordingly, the circuitry may store or access instructions for execution, or may implement its functionality in hardware alone. The instructions may be stored in a tangible storage medium that is other than a transitory signal, such as a flash memory, a Random Access Memory (RAM), a Read Only Memory (ROM), an Erasable Programmable Read Only Memory (EPROM); or on a magnetic or optical disc, such as a Compact Disc Read Only Memory (CDROM), Hard Disk Drive (HDD), or other magnetic or optical disk; or in or on another machine-readable medium. A product, such as a computer program product, may include a storage medium and instructions stored in or on the medium, and the instructions when executed by the circuitry in a device may cause the device to implement any of the processing described above or illustrated in the drawings.

The implementations may be distributed. For instance, the circuitry may include multiple distinct system components, such as multiple processors and memories, and may span multiple distributed processing systems. Parameters, databases, and other data structures may be separately stored and controlled, may be incorporated into a single memory or database, may be logically and physically organized in many different ways, and may be implemented in many different ways. Example implementations include linked lists, program variables, hash tables, arrays, records (e.g., database records), objects, and implicit storage mechanisms. Instructions may form parts (e.g., subroutines or other code sections) of a single program, may form multiple separate programs, may be distributed across multiple memories and processors, and may be implemented in many different ways. Example implementations include stand-alone programs, and as part of a library, such as a shared library like a Dynamic Link Library (DLL). The library, for example, may contain shared data and one or more shared programs that include instructions that perform any of the processing described above or illustrated in the drawings, when executed by the circuitry.

Many of the features described above are optional. For instance, cross-lot orchestration 266 and input from external data sources 264 need not be present in every implementation of the simulator system 202. Further, the simulator system 202 may be used separately to develop models without being included in an overall architecture with the access system 204. The opposite is also true. That is, the access system 204 may execute trained models without continuing feedback to and from the simulator system 202.

Further examples of optional feature are the sensors 216, enterprise data layer 228 and remote communication with parkers, e.g., through smartphone applications. Within each of these optional features, any combination of the specific elements may be included or omitted. For instance, the sensors 216 may omit the RFID circuitry and the gate/lift/barrier circuitry and sensors 226, while the enterprise data layer may include only the employee calendar data 230.

Several implementations have been specifically described. However, many other implementations are also possible.

What is claimed is:

1. A system comprising:
   a model set comprising individually tunable parking models adapted for individual parking characteristics, the individually tunable parking models specific to a pre-selected parking lot;
   a communication interface configured to receive:
      real-world parking sample data for the pre-selected parking lot from an access system physically located at the pre-selected parking lot; and
      external input on events beyond the real-world sample data and occurring outside of the pre-selected parking lot;
   a data testbed comprising trial data representing the real-world parking sample data and the external inputs; and
   a stepwise simulator comprising a digital replica of the pre-selected parking lot, the stepwise simulator configured to:
      accept trial data from the data testbed;
      select a target model from among the individually tunable parking models adapted for individual parking characteristics and for the pre-selected parking lot;
      simulate the pre-selected parking lot responsive to the trial data against the digital replica and using the target model;
      generate simulation metrics responsive to simulation of the pre-selected parking lot;
      determine whether the simulation metrics demonstrate improvement beyond a pre-defined update threshold; and
      communicate with the access system physically located at the pre-selected parking lot to cause the access system to perform a model update responsive to the simulation metrics demonstrating improvement beyond the pre-defined update threshold.

2. The system of claim 1, where:
   the real-world parking sample data captures instances of actual parking events at the pre-selected parking lot over a specified time period.

3. The system of claim 2, where:
   the real-world parking sample data comprises enterprise data layer characteristics of the actual parking events.

4. The system of claim 3, where:
   the enterprise data layer characteristics comprise enterprise calendar event data.

5. The system of claim 3, where:
the enterprise data layer characteristics comprise employee characteristic data.

6. The system of claim 1, where:
the simulation of the pre-selected parking lot includes simulation of parking actuators physically present at the pre-selected parking lot.

7. The system of claim 1, where:
the target model comprises a role specific model adapted to a pre-defined enterprise role of an individual parker.

8. The system of claim 1, where:
the target model comprises a maintenance specific model adapted to maintenance vehicles.

9. The system of claim 1, where:
the target model comprises an emergency specific model adapted to emergency vehicles.

10. A method comprising:
in a model simulator hardware processing system:
providing a model set comprising individually tunable parking models adapted for individual parking characteristics, the individually tunable parking models specific to a pre-selected parking lot;
with a communication interface, receiving:
real-world parking sample data for the pre-selected parking lot from an access system physically located at the pre-selected parking lot; and
external input on events beyond the real-world sample data and occurring outside of the pre-selected parking lot;
providing a data testbed comprising trial data representing the real-world parking sample data and the external inputs; and
executing a stepwise simulator comprising a digital replica of the pre-selected parking lot, where executing includes:
accepting trial data from the data testbed;
selecting a target model from among the individually tunable parking models adapted for individual parking characteristics and for the pre-selected parking lot;
simulating the pre-selected parking lot responsive to the trial data against the digital replica and using the target model;
generating simulation metrics responsive to simulation of the pre-selected parking lot;
determining whether the simulation metrics demonstrate improvement beyond a pre-defined update threshold; and
communicating with the access system physically located at the pre-selected parking lot to cause the access system to perform a model update responsive to the simulation metrics demonstrating improvement beyond the pre-defined update threshold.

11. The method of claim 10, where:
the real-world parking sample data comprises instances of actual parking events at the pre-selected parking lot over a specified time period.

12. The method of claim 11, where:
the real-world parking sample data comprises enterprise data layer characteristics of the actual parking events.

13. The method of claim 12, where:
the enterprise data layer characteristics comprise enterprise calendar event data.

14. The method of claim 12, where:
the enterprise data layer characteristics comprise employee characteristic data.

15. The method of claim 10, where:
simulating comprises simulating parking actuators physically present at the pre-selected parking lot.

16. The method of claim 10, where:
the target model comprises a role specific model adapted to a pre-defined enterprise role of an individual parker.

17. The method of claim 10, where:
the target model comprises a maintenance specific model adapted to maintenance vehicles.

18. The method of claim 10, where:
the target model comprises an emergency specific model adapted to emergency vehicles.

19. A system comprising:
a model set comprising individually tunable parking models adapted for individual parking characteristics, the individually tunable parking models specific to a pre-selected parking lot and including a role specific parking model for a member of an pre-determined enterprise having a pre-determined role within an enterprise;
a communication interface configured to receive:
parking sample data for the pre-selected parking lot and for the pre-determined role from an access system physically located at the pre-selected parking lot; and
external input on events happening outside the pre-selected parking lot;
a data testbed comprising trial data representing the parking sample data and the external inputs; and
a stepwise simulator comprising a digital replica of the pre-selected parking lot, the stepwise simulator configured to:
accept trial data from the data testbed;
select the role specific parking model from among the individually tunable parking models;
simulate the pre-selected parking lot responsive to the trial data against the digital replica and using the role specific parking model;
generate simulation metrics responsive to simulation of the pre-selected parking lot with the role specific parking model;
determine whether the simulation metrics demonstrate improvement beyond a pre-defined update threshold; and
communicate with the access system physically located at the pre-selected parking lot to cause the access system to perform a model update responsive to the simulation metrics demonstrating improvement beyond the pre-defined update threshold.

20. The system of claim 19, where:
the parking sample data further comprises data elements from an enterprise data layer for the pre-determined enterprise, the data elements comprising:
calendar meeting data for the member;
calendar task data for the member;
human resources data for the member, or any combination thereof.

* * * * *